(12) United States Patent
Muramatsu

(10) Patent No.: US 7,078,980 B2
(45) Date of Patent: Jul. 18, 2006

(54) VOLTAGE CONTROLLED OSCILLATOR WITH SWITCHED TUNING CAPACITORS

(75) Inventor: Yoshinori Muramatsu, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 277 days.

(21) Appl. No.: 10/761,353

(22) Filed: Jan. 22, 2004

(65) Prior Publication Data

US 2004/0150485 A1 Aug. 5, 2004

(30) Foreign Application Priority Data

Jan. 24, 2003 (JP) ........................... 2003-016370

(51) Int. Cl.
*H03B 5/00* (2006.01)

(52) U.S. Cl. .................. 331/117 R; 331/117 FE; 331/177 V

(58) Field of Classification Search .......... 331/117 R, 331/177 V, 117 FE, 179, 36 C
See application file for complete search history.

(56) References Cited

U.S. PATENT DOCUMENTS

| 3,988,701 A | * | 10/1976 | Funston ................ 331/179 |
| 6,876,266 B1 | * | 4/2005 | Koo et al. ............. 331/117 R |
| 2004/0080374 A1 | * | 4/2004 | Muramatsu ............ 331/117 R |
| 2004/0169564 A1 | * | 9/2004 | Muramatsu ............ 331/177 V |

OTHER PUBLICATIONS

A. Krai et al., "RF-CMOS Oscillators with Switched Tuning", IEEE Custom Integrated Circuits Conference, pp. 555-558, 1998.

* cited by examiner

*Primary Examiner*—Joseph Chang
(74) *Attorney, Agent, or Firm*—McGinn & Gibb, PLLC

(57) ABSTRACT

The LC-VCO is provided with two negative resistance units and an LC circuit unit. The LC circuit unit has two output terminals. An inductor is connected between the output terminals, and a series of variable capacitors is connected in parallel with the inductor. In the LC circuit unit, a variable capacitor is connected between one of the output terminals and a node. Another variable capacitor is connected between the other output terminal and another node. Switches are connected between the nodes and a ground potential line, respectively, and between the nodes and a power supply potential line, respectively.

9 Claims, 6 Drawing Sheets

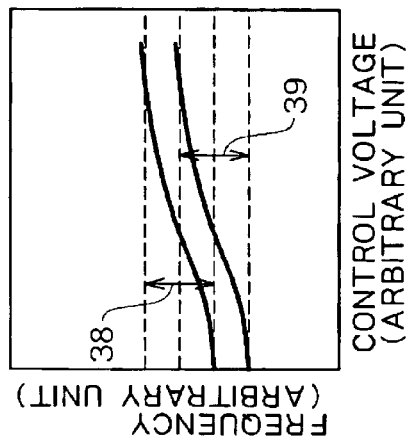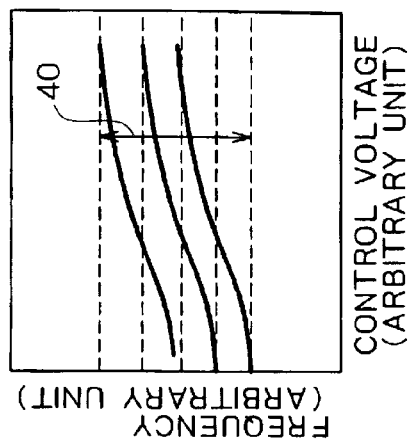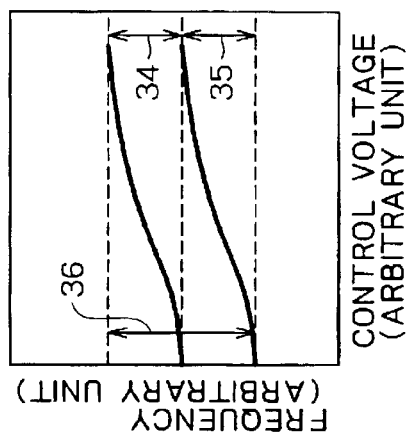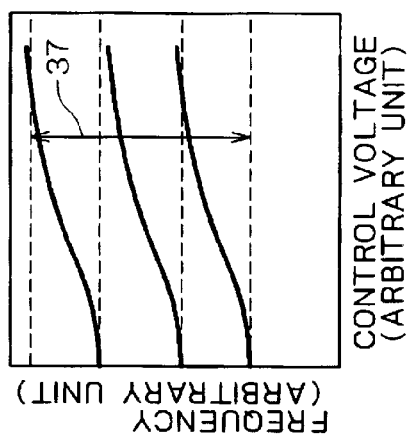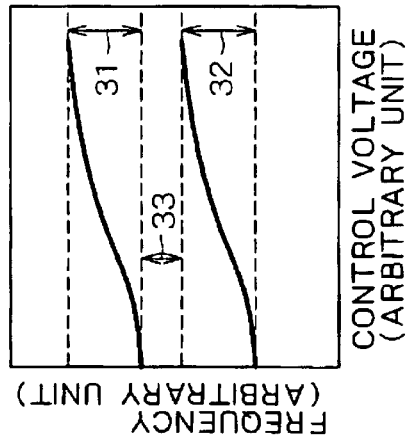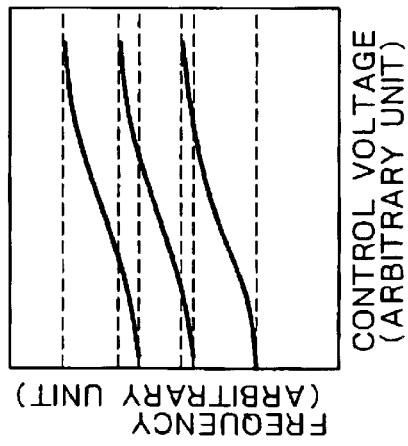

VOLTAGE CONTROLLED OSCILLATOR WITH SWITCHED TUNING CAPACITORS

BACKGROUND OF THE INVENTION

1. Field of the Invention

The present invention relates to a voltage controlled oscillator which utilizes resonance of a parallel LC tank circuit. In particular, the invention relates to a voltage controlled oscillator which has a capacitance switch and is capable of changing its oscillation frequency stepwise.

2. Description of the Related Art

Conventionally, voltage controlled oscillators (VCOs) such as a ring oscillator have been used as local oscillators (LOs) in phase-locked loop (PLL) circuits which are used for frequency multiplication and phase synchronization.

For such local oscillators, voltage controlled oscillators utilizing resonance of a parallel LC tank circuit (LC-VCOs) have been used recently. An LC-VCO has an inductor and a variable capacitor which are connected in parallel to form a parallel LC tank circuit. This parallel LC tank circuit causes resonance to oscillate, or output, an alternating-current signal having the resonant frequency. The resonant frequency refers to a frequency at which the parallel LC tank circuit exhibits infinite impedance. The resonance refers to the phenomenon that a current flows through the inductor and the variable capacitor of the parallel LC circuit alternately. The variable capacitor is composed of varactor devices or the like, and varies in capacitance depending on a control voltage applied thereto. The resonant frequency f is given by the following equation 1:

$$f = \frac{1}{2\pi\sqrt{LC}} \quad \text{(Equation 1)}$$

where L is the inductance of the inductor, and C is the capacitance of the variable capacitor. The foregoing equation 1 shows that the capacitance C of the variable capacitor can be increased to lower the resonant frequency f.

As compared to the conventional VCOs using a ring oscillator or the like, the LC-VCO has the following advantages. Firstly, the LC-VCO produces smaller noise as compared to the conventional VCOs using a ring oscillator or the like. The reason for this is that the basic principle of the LC-VCO, i.e., the resonance of the parallel LC tank circuit requires a smaller number of transistors which can cause noise. The LC-VCO is thus suitable for high-speed optical communications, cellular phones, wireless LANs, etc. Secondly, since its basic principle lies in LC-circuit resonance, the LC-VCO can provide high oscillation frequencies more easily than VCOs that are made of transistors and utilize logic-gate delays. Thirdly, the LC-VCO has a narrower range of variation in oscillation frequency with respect to the control voltage. This means a lower tuning sensitivity and less variations of the oscillation frequency resulting from fluctuations in the control voltage, with the result of lower noise.

In the meantime, one of the drawbacks of the LC-VCO is also the low tuning sensitivity mentioned above. While it is advantageous in terms of noise as described above, the low tuning sensitivity narrows the range of variation in oscillation frequency and thus makes it difficult to design LC-VCOs of desired oscillation frequencies.

To overcome this drawback, LC-VCOs having a capacitance switch have been proposed (for example, see A. Kral et al., "RF-CMOS Oscillators with Switched Tuning", IEEE Custom Integrated Circuits Conf., pp. 555–558, 1998). FIG. 1 is an equivalent circuit diagram showing a conventional LC-VCO having a capacitance switch. FIG. 2 is a graph for showing the range of variation in the oscillation frequency of this conventional LC-VCO, in which the abscissa indicates the control voltage applied to the variable capacitor and the ordinate indicates the oscillation frequency of the LC-VCO.

As shown in FIG. 1, this conventional LC-VCO 101 is connected to a power supply potential line VCC and a ground potential line GND. The LC-VCO 101 has a negative resistance unit 2, an LC circuit unit 104, and a negative resistance unit 3 which are arranged in this order from the power supply potential line VCC to the ground potential line GND.

The negative resistance unit 2 has P-channel transistors 5 and 6. Either one of the source and drain of the P-channel transistor 5 is connected to the power supply potential line VCC. The other of the source and drain is connected to an output terminal 7 of the LC circuit unit 104. The gate is connected to an output terminal 8 of the same. Either one of the source and drain of the P-channel transistor 6 is connected to the power supply potential line VCC. The other of the source and drain is connected to the output terminal 8 of the LC circuit unit 104. The gate is connected to the output terminal 7.

The LC circuit 104 has an inductor 9 between the output terminals 7 and 8. A series of variable capacitors 10 and 11 is also connected between the output terminals 7 and 8, in parallel with the inductor 9. The variable capacitors 10 and 11 are capacitors which vary in capacitance according to a control voltage input thereto, or namely, varactor devices. The LC circuit unit 104 also has a capacitance switch unit 116. The capacitance switch unit 116 has capacitors 112 and 113, and switches 14 and 15. The output terminal 7 is connected to one electrode 112b of the capacitor 112. The other electrode 112a of this capacitor 112 is connected to one of the terminals of the switch 14. The other terminal of this switch 14 is connected to a ground electrode. That is, the switch 14 is intended to switch the electrode 112a between being connected to the ground electrode and floating. Similarly, the output terminal 8 is connected to the ground electrode via the capacitor 113 and the switch 15. That is, the switch 15 is intended to switch an electrode 113a of the capacitor 113 between being connected to the ground electrode and floating. The switches 14 and 15 are made of an N-channel transistor each.

The negative resistance unit 3 has N-channel transistors 17 and 18. Either one of the source and drain of the N-channel transistor 17 is connected to the output terminal 7 of the LC circuit unit 104. The other of the source and drain is connected to the ground potential line GND. The gate is connected to the output terminal 8. Either one of the source and drain of the N-channel transistor 18 is connected to the output terminal 8. The other of the source and drain is connected to the ground potential line GND. The gate is connected to the output terminal 7.

Next, description will be given of the operation of this conventional LC-VCO 101. When the LC circuit unit 104 is subjected to any electrical stimulation, for example, by the LC-VCO 101 being connected to the power supply potential line VCC and the ground potential line GND, alternative-current signals having the resonant frequency of the LC circuit unit 104 are output from the output terminals 7 and 8. In this case, the signals output from the output terminals 7 and 8 are complementary signals.

The LC circuit 104 by itself cannot sustain the oscillations due to a current loss resulting from its parasitic resistance. Then, a positive power supply potential is applied to the power supply potential line VCC and a ground potential is applied to the ground potential line GND to supply the LC-VCO 101 with an electric current. This combines with the provision of the negative resistance units 2 and 3 to allow permanent oscillation of resonant waves from the LC circuit unit 104.

More specifically, for example, when the output terminal 7 is low level and the output terminal 8 is high level, the P-channel transistor 5 turns off and the N-channel transistor 17 turns on. As a result, the ground potential is applied to the output terminal 7. Since the P-channel transistor 6 turns on and the N-channel transistor 18 turns off, the power supply potential is applied to the output terminal 8. Similarly, when the output terminal 7 is high level and the output terminal 8 is low level, the power supply potential is applied to the output terminal 7 and the ground potential is applied to the output terminal 8. This sustains the oscillations from the output terminals 7 and 8 without attenuation.

Then, the control voltage applied to the variable capacitors 10 and 11 is changed to vary the capacitances of the variable capacitors 10 and 11 continuously. Consequently, as shown in FIG. 2, the resonant frequency of the LC circuit unit 104 varies with the control voltage, allowing a change in the frequency of the alternating-currents output from the LC-VCO 101.

The switches 14 and 15 can also be switched to change the total capacitance of the capacitance switch unit 116. When the switch 14 is turned off, the electrode 112a of the capacitor 112 at the side of the switch 14 enters a high impedance state, and becomes almost the same as the electrode 112b of the capacitor 112 at the side of the output terminal 7 in potential. This prevents the capacitor 112 from functioning as a capacitance. Similarly, when the switch 15 is turned off, the electrode 113a enters a high impedance state to prevent the capacitor 113 from functioning as a capacitance. Consequently, turning off the switches 14 and 15 decreases the total capacitance of the LC circuit unit 104 and, from the foregoing equation 1, increases the oscillation frequency.

On the other hand, when the switch 14 is turned on, the electrode 112a of the capacitor 112 is connected to the ground electrode and the capacitor 112 functions as a capacitance. Similarly, when the switch 15 is turned on, the electrode 113a of the capacitor 113 is connected to the ground electrode and the capacitor 113 functions as a capacitance. Consequently, turning on the switches 14 and 15 increases the total capacitance of the LC circuit unit 104 and, from the foregoing equation 1, decreases the oscillation frequency. As above, the switches 14 and 15 can be turned on/off to change the oscillation frequency discontinuously.

As a result of this, when the capacitance switch unit 116 is operated to change the oscillation frequency stepwise and the control voltage of the variable capacitors 10 and 11 is modified to change the oscillation frequency continuously as shown in FIG. 2, it is possible to extend the range of variation in the oscillation frequency as compared to the case where the capacitance switch unit 116 is not provided, while maintaining the tuning sensitivity low to suppress variations of the oscillation frequency resulting from fluctuations in the control voltage. The provision of the capacitance switch unit 116 also makes it possible to change the oscillation frequency band arbitrarily. This facilitates providing a plurality of frequencies required for such applications as error correction in a communication system.

The foregoing conventional technology, however, has the following problem. The conventional LC-VCO 101 shown in FIG. 1 can somewhat extend the range of variation in oscillation frequency by switching the switches 14 and 15 to change the oscillation frequency in two levels as shown in FIG. 2. Turning on/off the switches 14 and 15, however, can only provide two levels of switching at best, being far from a sufficient range of variation in oscillation frequency.

SUMMARY OF THE INVENTION

It is an object of the present invention to provide a voltage controlled oscillator having a wide range of variation in oscillation frequency.

A voltage controlled oscillator according to the present invention comprises: a resonance unit having first and second output terminals, for causing oscillations to output complementary alternating-current signals from the first and second output terminals; and an amplifying unit for fixing a high level potential and a low level potential of the signals output from the first and second output terminals to a first potential and a second potential lower than the first potential, respectively.

The resonance unit comprises: an inductor connected between the first and second output terminals; a first variable capacitor connected in parallel with this inductor; a second variable capacitor having one of its electrodes connected to the first output terminal; a third variable capacitor having one of its electrodes connected to the second output terminal; a first switch for switching the other electrode of the second variable capacitor between floating and being subjected to a third potential; a second switch for switching the other electrode of the second variable capacitor between floating and being subjected to a fourth potential different from the third potential; a third switch for switching the other electrode of the third variable capacitor between floating and being subjected to the third potential; and a fourth switch for switching the other electrode of the third variable capacitor between floating and being subjected to the fourth potential.

The first and third switches cooperate with each other to switch both the other electrodes of the second and third variable capacitors between floating and being subjected to the third potential. The second and fourth switches cooperate with each other to switch both the other electrodes of the second and third variable capacitors between floating and being subjected to the fourth potential.

In the present invention, the inductor and the first through third variable capacitors constitute the resonance unit. This resonance unit can be supplied with the first and second potentials by the amplifying unit to output alternating-current signals having the same frequency as the resonant frequency of the resonance unit. And, the first and second output terminals output complementary signals. Then, the capacitance of the first variable capacitor can be varied to change the resonant frequency of the resonance unit continuously, causing a continuous change in the frequency of the alternating-current signals to be output.

Moreover, in the present invention, all of the first through fourth switches can be turned off to bring the other electrodes of the second and third variable capacitors into a high impedance state so that the second and third variable capacitors have an extremely small capacitance. This reduces the total capacitance of the resonance unit and thus increases the frequency of the alternating-current signals output from the first and second output terminals. The frequency of the alternating-current signals here shall be a first frequency.

Now, turning the first and third switches on and the second and fourth switches off can apply the third potential to the other electrodes of the second and third variable capacitors so that the second and third variable capacitors have a predetermined capacitance. This increases the total capacitance of the resonance unit as compared to the foregoing case where the first through fourth switches are all turned off. The alternating-current signals can thus be given a second frequency which is higher than the first frequency.

Furthermore, turning the first and third switches off and the second and fourth switches on can apply the fourth potential to the other electrodes of the second and third variable capacitors so that the second and third variable capacitors have another predetermined capacitance. The alternating-current signals can thus be given a third frequency which is higher than the first frequency and different from the second frequency.

As a result, the frequency of the alternating-current signals output from the first and second output terminals can be changed in three levels. It is therefore possible to extend the range of variation in the frequency of the alternating-current signals.

The first variable capacitor is preferably made of a varactor device to which a control voltage is input and which varies in capacitance in accordance with this control voltage. The second and third variable capacitors are also preferably made of varactor devices to which a control voltage is input and which vary in capacitance in accordance with this control voltage. This makes it possible to achieve variable capacitors which occupy a smaller area.

A plurality of capacitance switch units each comprising the second and third variable capacitors and the first through fourth switches may also be provided. These capacitance switch units may be connected between the first and second output terminals, in parallel with each other. The plurality of capacitance switch units can be controlled separately to change the frequency of the output alternating-current signals in four or more levels.

According to the present invention, the capacitance of the first variable capacitor can be changed to cause a continuous change in the frequency of the output alternating-current signal. Besides, the first through fourth switches can be controlled to change the frequency of the alternating-current signal in three levels. It is therefore possible to provide a voltage controlled oscillator having a wide range of variation in the frequency of its output signal.

BRIEF DESCRIPTION OF THE DRAWINGS

FIGS. 7A to 7F are graphs for showing the ranges of variation in the oscillation frequencies of LC-VCOs, in each of which the abscissa indicates the control voltage and the ordinate indicates the oscillation frequency; FIGS. 7A to 7C show those of conventional LC-VCOs, and FIGS. 7D to 7F show those of LC-VCOs according to the present embodiment.

DETAILED DESCRIPTION OF THE PREFERRED EMBODIMENT

Figure 3:
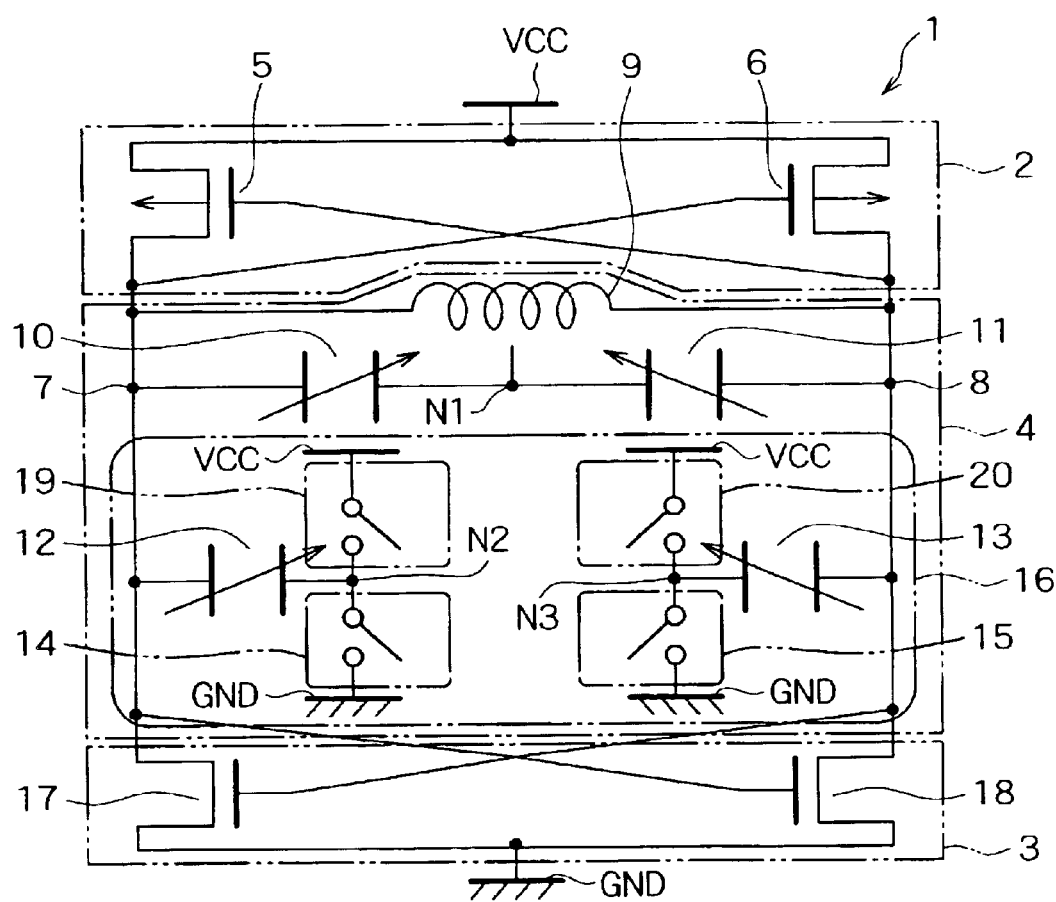
FIG. 3 is an equivalent circuit diagram showing an LC-VCO according to an embodiment of the present invention.
Figure 4:
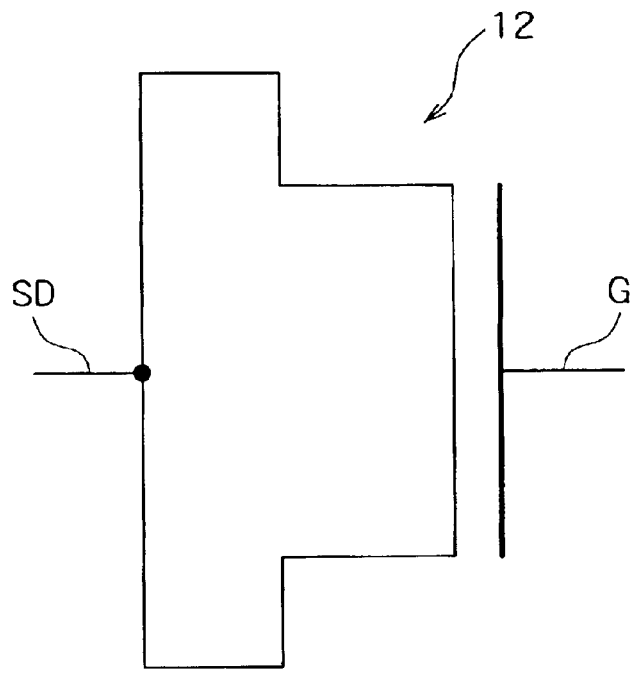
FIG. 4 is an equivalent circuit diagram showing a varactor device to be used as variable capacitors.
Figure 5:
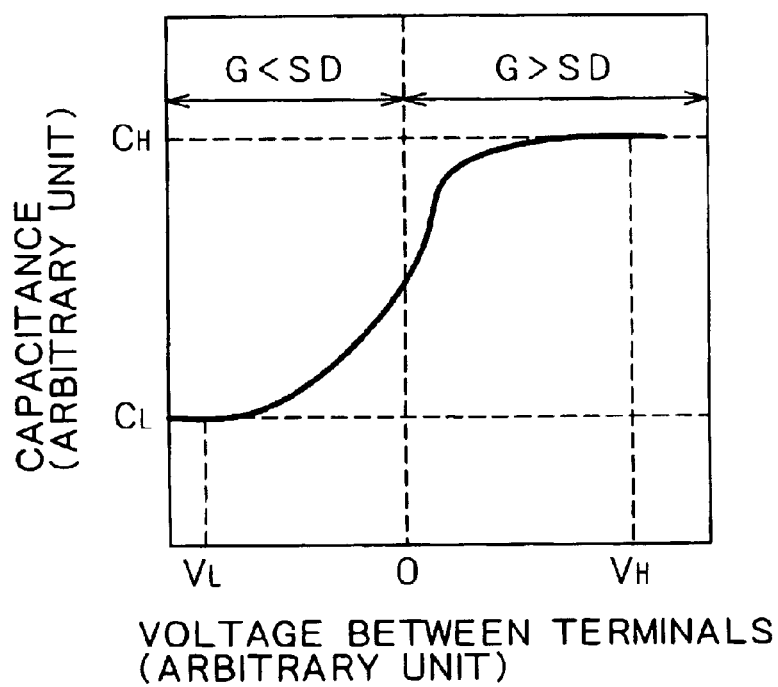
FIG. 5 is a graph for showing the dependence of the capacitance of the varactor device on voltage, in which the abscissa indicates the voltage applied between the terminals of the varactor device, and the ordinate the capacitance of this varactor device.
Figure 6:
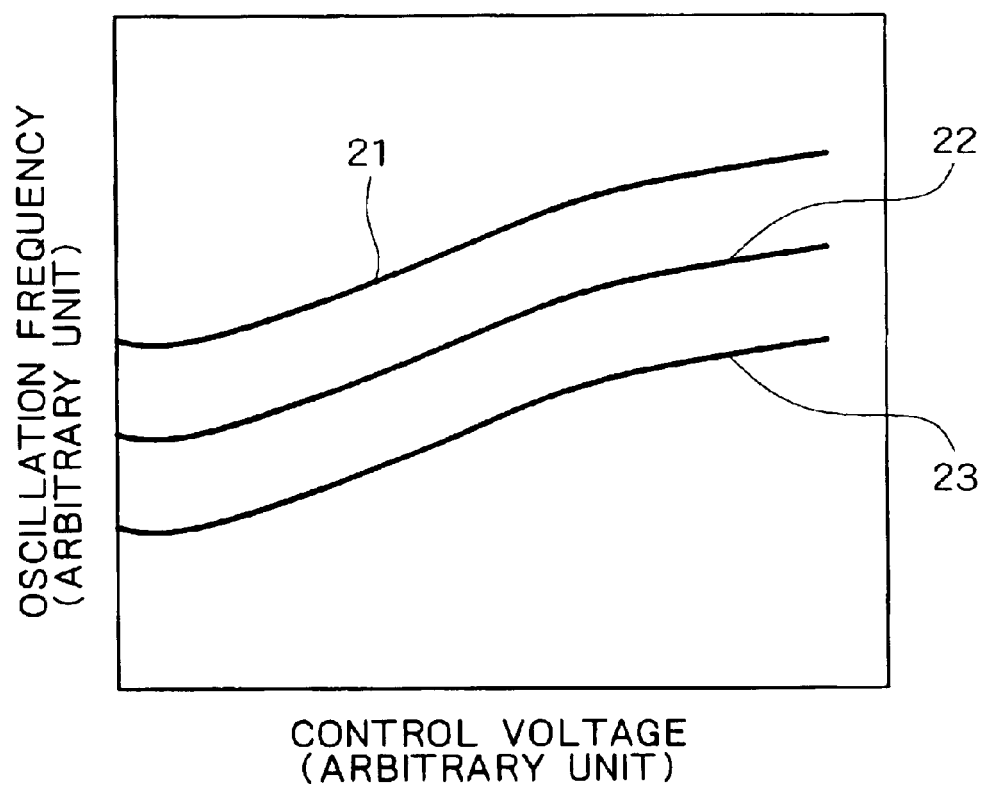
FIG. 6 is a graph for showing the range of variation in the oscillation frequency of the LC-VCO according to the present embodiment, in which the abscissa indicates the control voltage to be applied to the variable capacitors and the ordinate the oscillation frequency of the LC-VCO.

Hereinafter, an embodiment of the present invention will be described in detail with reference to the accompanying drawings. FIG. 3 is an equivalent circuit diagram showing an LC-VCO according to the present embodiment. FIG. 4 is an equivalent circuit diagram showing a varactor device to be used as variable capacitors. FIG. 5 is a graph for showing the dependence of the capacitance of the varactor device on voltage, in which the abscissa indicates the voltage applied between the terminals of the varactor device, or equivalently, the potential of the G terminal to the SD terminal, and the ordinate indicates the capacitance of this varactor device. FIG. 6 is a graph for showing the range of variation in the oscillation frequency of the LC-VCO according to the present embodiment, in which the abscissa indicates the control voltage to be applied to the variable capacitors and the ordinate indicates the oscillation frequency of the LC-VCO. FIGS. 7A to 7F are graphs for showing the ranges of variation in the oscillation frequencies of LC-VCOs, in each of which the abscissa indicates the control voltage and the ordinate the oscillation frequency. FIGS. 7A to 7C show those of conventional LC-VCOs, and FIGS. 7D to 7F show those of LC-VCOs according to the present embodiment.

As shown in FIG. 3, the voltage controlled oscillator according to the present embodiment, or an LC-VCO 1, is connected to a power supply potential line VCC and a ground potential line GND. The LC-VCO 1 is formed as an integrated circuit on a semiconductor substrate (not shown), for example. The LC-VCO 1 is used, for example, as a local oscillator (LO) of a phase-locked loop circuit (PLL circuit) which is used for frequency multiplication and phase synchronization.

The LC-VCO 1 according to the present embodiment has a negative resistance unit 2, a resonance unit or LC circuit unit 4, and a negative resistance unit 3 which are arranged in this order from the power supply potential line VCC to the ground potential line GND. The negative resistance units 2 and 3 have the same configuration as that of the negative resistance units 2 and 3 provided in the conventional LC-VCO 101 described above (see FIG. 1). The negative resistance units 2 and 3 constitute an amplifying unit.

The LC circuit unit 4 has output terminals 7 and 8. The output terminal 7 is connected to either one of the source and drain of the P-channel transistor 5 in the negative resistance unit 2, the one not being connected with the power supply potential line VCC, and either one of the source and drain of the N-channel transistor 17 in the negative resistance unit 3, the one not being connected with the ground potential line GND. The output terminal 8 is connected to either one of the source and drain of the P-channel transistor 6 in the negative resistance unit 2, the one not being connected with the power supply potential line VCC, and either one of the source and drain of the N-channel transistor 18 in the negative resistance unit 3, the one not being connected with the ground potential line GND. The output terminals 7 and 8 are intended to output the output signal of the LC circuit unit 4 as complementary signals.

An inductor 9 is connected between the output terminals 7 and 8. An example of the inductor 9 is a spiral inductor which is formed on the topmost wiring layer of multilevel wiring layers provided on the semiconductor substrate. A series of variable capacitors 10 and 11 is also connected between the output terminals 7 and 8. That is, the circuit consisting of the variable capacitors 10 and 11 is connected in parallel with the inductor 9. The variable capacitors 10 and 11 are capacitors which vary in capacitance in accordance with a control voltage input thereto, such as varactor devices. A node N1 between the variable capacitors 10 and 11 is subjected to the control voltage.

The LC circuit unit 4 also has a capacitance switch unit 16 which is connected with the output terminals 7 and 8. The capacitance switch unit 16 includes variable capacitors 12 and 13, and switches 14, 15, 19, and 20. Either one of the electrodes of the variable capacitor 12 is connected to the output terminal 7, and the other is connected to a node N2. The switch 14 is arranged between the node N2 and the ground potential line GND. The switch 19 is arranged between the node N2 and the power supply potential line VCC. That is, the switch 14 is intended to switch the node N2 between being connected to the ground potential line GND and floating. The switch 19 is intended to switch the node N2 between being connected to the power supply potential line VCC and floating. Moreover, either one of the electrodes of the variable capacitor 13 is connected to the output terminal 8, and the other is connected to a node N3. The switch 15 is arranged between the node N3 and the ground potential line GND. The switch 20 is arranged between the node N3 and the power supply potential line VCC. That is, the switch 15 is intended to switch the node N3 between being connected to the ground potential line GND and floating. The switch 20 is intended to switch the node N3 between being connected to the power supply potential line VCC and floating. For example, the switches 14 and 15 are made of N-channel transistors, and the switches 19 and 20 are made of P-channel transistors.

As shown in FIG. 4, examples of the variable capacitors 12 and 13 are MOS type varactor devices. For example, the varactor device that constitutes the variable capacitor 12 is connected to the node N2 at its source-drain terminal (SD terminal), and to the output terminal 7 at its gate terminal (G terminal). Similarly, the varactor device that constitutes the variable capacitor 13 is connected to the node N3 at its SD terminal, and to the output terminal 8 at its G terminal. Each of the varactor devices forms a capacitance between the SD terminal and the G terminal.

As shown in FIG. 5, the capacitance of a varactor device depends on the voltage applied between the SD terminal and the G terminal, or the potential of the G terminal to the SD terminal. With increasing voltage between the terminals, the capacitance of the varactor device increases monotonously. In FIG. 5, the voltage between the terminals is negative in the domain where the G terminal is lower than the SD terminal in potential, i.e., where the output terminal 7 is lower than the node N2 in potential. The voltage between the terminals is positive in the domain where the G terminal is higher than the SD terminal in potential, i.e., the output terminal 7 is higher than the node N2 in potential.

Now, description will be given of the operation of this LC-VCO 1. Initially, as shown in FIG. 3, the LC-VCO 1 is connected to the power supply potential line VCC and the ground potential line GND. This puts the LC circuit unit 4 out of balance in potential, applying an electrical stimulation to the LC circuit unit 4. As a result, the LC circuit unit 4 causes oscillations to output alternating-current signals having the resonant frequency of the LC circuit unit 4 from the output terminals 7 and 8. In this case, the signals output from the output terminals 7 and 8 are complementary signals. Then, as in the conventional LC-VCO described above, the negative resistance units 2 and 3 supply the LC circuit unit 4 with a current in synchronization with the potential variations of the output terminals 7 and 8. More specifically, the amplifying unit composed of the negative resistance units 2 and 3 fixes the high level potential and low level potential of the signals output from the output terminals 7, 8 to the power supply potential and ground potential, respectively. This sustains the oscillations from the output terminals 7 and 8.

At this time, if all the switches 14, 15, 19, and 20 are turned off, the nodes N2 and N3 enter a floating state, or high impedance state, in which the variable capacitors 12 and 13 are prevented from functioning as capacitances. This decreases the total capacity of the capacitance switch unit 16 significantly, so that the LC circuit unit 4 exhibits a relatively small capacitance. From the foregoing equation 1, the output signals output from the output terminals 7 and 8 thus increase in oscillation frequency.

If the switches 14 and 15 are turned off and the switches 19 and 20 are turned on, the power supply potential is applied to the nodes N2 and N3. Consequently, the SD terminals of the varactor devices constituting the variable capacitors 12 and 13 undergo the power supply potential. Meanwhile, the G terminals of these varactor devices are subjected to the alternating-current signals output from the output terminals 7 and 8. Since the potentials of the alternating-current signals have temporal averages to come between the power supply potential and the ground potential, the averages of the potentials applied to the respective G terminals are below the power supply potential.

As shown in FIG. 5, in each of the varactor devices, the voltage between the terminals or the potential of the G terminal to the SD terminal thus has a negative value $V_L$, which gives the varactor device a predetermined capacitance of $C_L$. Consequently, as compared to the case where all the switches 14, 15, 19, and 20 are turned off, the total capacitance of the capacitance switch unit 16 becomes higher to increase the capacitance of the LC circuit unit 4. From the foregoing equation 1, the output signals output from the output terminals 7 and 8 thus have an oscillation frequency lower than when the switches 14, 15, 19, and 20 are all off.

If the switches 14 and 15 are turned on and the switches 19 and 20 are turned off, the ground potential is applied to the nodes N2 and N3. As a result, the SD terminals of the varactor devices constituting the variable capacitors 12 and 13 undergo the ground potential. Meanwhile, the G terminals of these varactor devices are subjected to the alternating-current signals output from the output terminals 7 and 8. At this time, the potentials applied to the G terminals have averages higher than the ground potential.

As shown in FIG. 5, in each of the varactor devices, the voltage between the terminals or the potential of the G terminal to the SD terminal thus has a positive value $V_H$, which gives the varactor device a capacitance $C_H$ higher than the foregoing value $C_L$. Consequently, as compared to the foregoing case where the switches 14 and 15 are turned off and the switches 19 and 20 are turned on, the total capacitance of the capacitance switch unit 16 becomes even higher with a further increase in the capacitance of the LC circuit unit 4. From the foregoing equation 1, the output signals output from the output terminals 7 and 8 thus become even lower in oscillation frequency.

In summary, as shown in FIG. 6, the oscillation frequency of the LC-VCO 1 becomes relatively high when all the switches 14, 15, 19, and 20 are turned off to bring the nodes N2 and N3 into a high impedance state. In the meantime, when the control voltage applied to the node N1 is changed, the variable capacitors 10 and 11 vary in capacitance to cause a continuous change in the oscillation frequency of the LC-VCO 1. It follows that the oscillation frequency of the LC-VCO 1 traces a line 21 in FIG. 6. Now, when the switches 14 and 15 are turned off and the switches 19 and 20 are turned on to give the nodes N2 and N3 the power supply potential, the oscillation frequency of the LC-VCO 1 traces a line 22 which lies below the line 21. Moreover, when the switches 14 and 15 are turned on and the switches 19 and 20 are turned off to give the nodes N2 and N3 the ground potential, the oscillation frequency of the LC-VCO 1 traces a line 23 which lies below the lines 21 and 22. In respects other than the foregoing, the LC-VCO 1 of the present embodiment makes the same operations as those of the conventional LC-VCO 101 described above.

As compared to the conventional LC-VCO, the LC-VCO of the present embodiment thus provides the following effects. Take, for example, the case shown in FIG. 7A where a conventional LC-VCO has two ranges of variation 31 and 32 in oscillation frequency which are separate from each other and there is an uncovered frequency band 33 between the ranges of variation 31 and 32. This conventional LC-VCO can be replaced with an LC-VCO of the present embodiment to eliminate the uncovered frequency band as shown in FIG. 7D.

In FIG. 7B, a conventional LC-VCO has two ranges of variation 34 and 35 in oscillation frequency which adjoin each other to form a single range of variation 36. This conventional LC-VCO can be replaced with an LC-VCO of the present embodiment to form a range of variation 37 that is 1.5 times wider than the range of variation 36 as shown in FIG. 7E.

In the cases of FIGS. 7B and 7E, however, there occurs a frequency across which continuous change cannot be made by the control voltage, on the border between two adjoining ranges of variation. To avoid this, the ranges of variations must overlap with each other. FIG. 7C shows the case where a conventional LC-VCO has two overlapping ranges of variation 38 and 39 in oscillation frequency. Even in this case, the conventional LC-VCO can be replaced with an LC-VCO of the present embodiment to extend the entire range of variation 40 as shown in FIG. 7F. For high LC-VCO operability, the ranges of variation where a continuous change can be made by the control voltage preferably overlap by approximately ½ each other.

Figure 1:
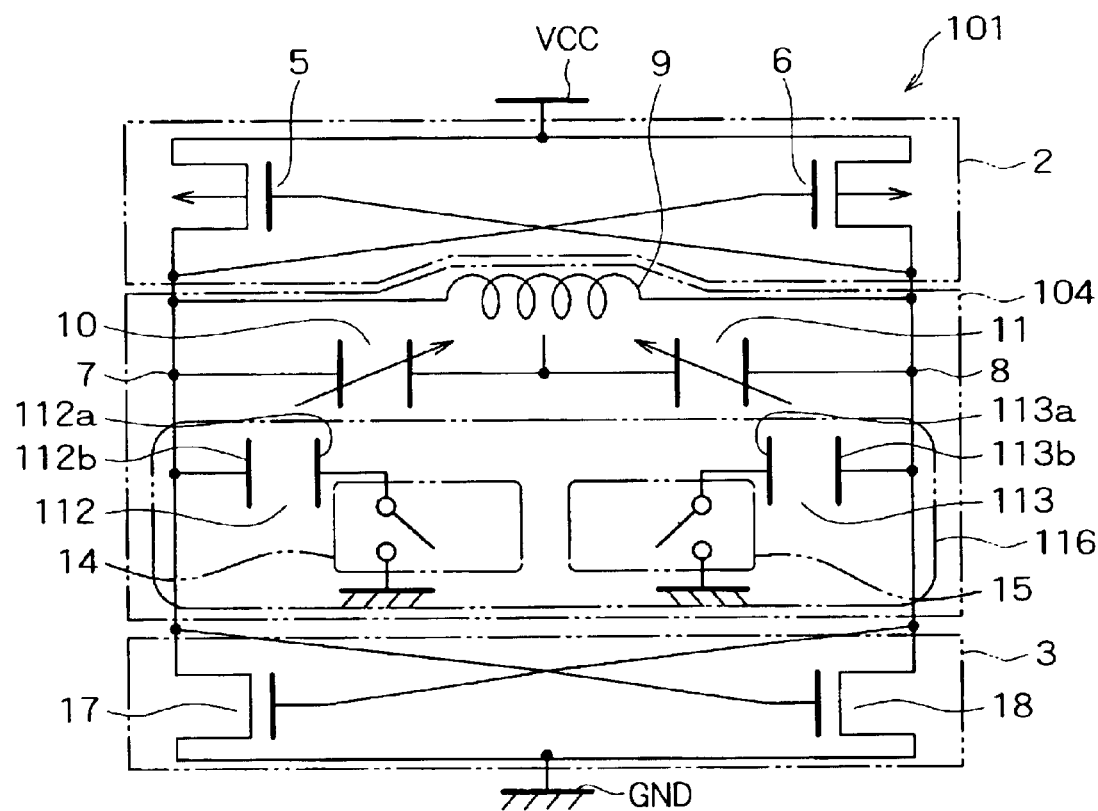
FIG. 1 is an equivalent circuit diagram showing a conventional LC-VCO having a capacitance switch.
Figure 2:
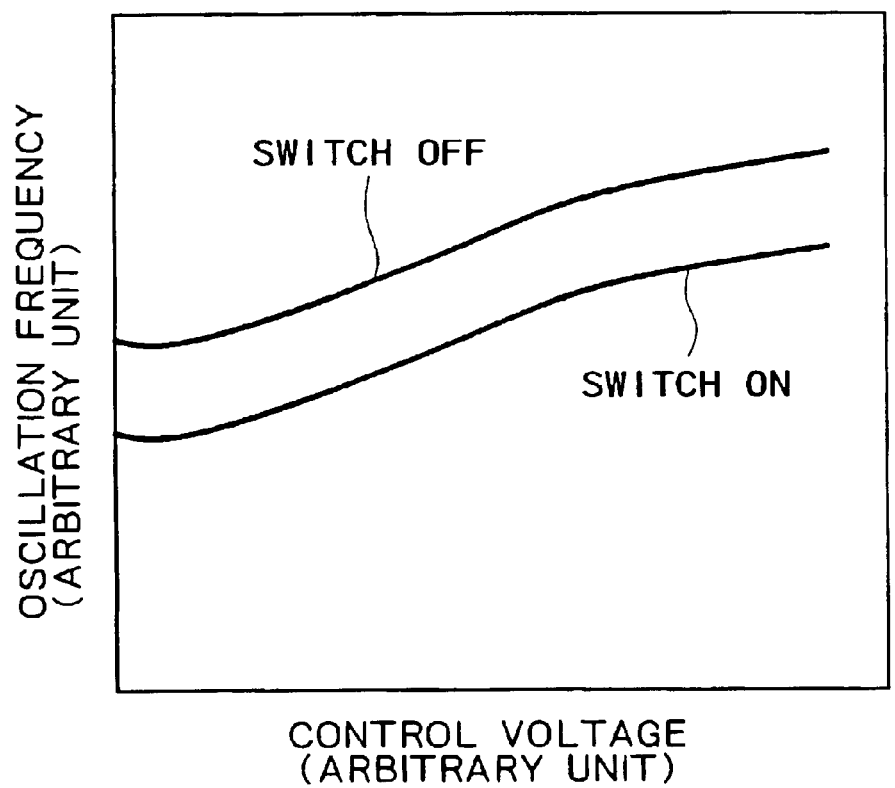
FIG. 2 is a graph for showing the range of variation in the oscillation frequency of the conventional LC-VCO, in which the abscissa indicates the control voltage to be applied to the variable capacitors and the ordinate indicates the oscillation frequency of the LC-VCO.

As above, the LC-VCO 1 according to the present embodiment can change its oscillation frequency in three levels by turning on/off the switches 14, 15, 19, and 20. As compared to conventional LC-VCOs such as shown in FIG. 1, it is therefore possible to extend the range of variation in oscillation frequency. Besides, the oscillation frequency can be changed continuously by modifying the control voltage applied to the node N1. As a result, it is possible to provide an LC-VCO having a low tuning sensitivity and a wide range of variation in oscillation frequency.

In the LC-VCO 1 according to the present embodiment, the provision of the capacitance switch unit 16 allows arbitrary change of the oscillation frequency band. This facilitates providing a plurality of frequencies required for such applications as error correction in a communication system.

Still, The present embodiment has dealt with the case where the varactor devices constituting the variable capacitors 12 and 13 are connected to the nodes N2 and N3 at their SD terminals and to the output terminals 7 and 8 at their G terminals, respectively. However, the connections may be inverted. In this case, the oscillation frequency of the LC-VCO 1 becomes lower when the power supply potential is applied to the nodes N2 and N3 than when the ground potential is applied to the nodes N2 and N3.

While the LC-VCO 1 has only a single capacitance switch unit 16, a plurality of capacitance switch units 16 may be provided and connected in parallel between the output terminals 7 and 8. Then, the switches in the capacitance switch units 16 can be turned on/off separately to change the oscillation frequency of the LC-VCO 1 stepwise in four or more levels.

What is claimed is:

1. A voltage controlled oscillator comprising:
a resonance unit having first and second output terminals, for causing oscillations to output complementary alternating-current signals from said first and second output terminals, said resonance unit comprising:
an inductor connected between said first and second output terminals;
a first variable capacitor connected in parallel with said inductor;
a second variable capacitor having one of its electrodes connected to said first output terminal;
a third variable capacitor having one of its electrodes connected to said second output terminal;
a first switch for switching the other electrode of said second variable capacitor between floating and being subjected to a third potential;
a second switch for switching the other electrode of said second variable capacitor between floating and being subjected to a fourth potential different from said third potential;
a third switch for switching the other electrode of said third variable capacitor between floating and being subjected to said third potential; and
a fourth switch for switching the other electrode of said third variable capacitor between floating and being subjected to said fourth potential; and
an amplifying unit for fixing a high level potential and a low level potential of the signals output from said first and second output terminals to a first potential and a second potential lower than the first potential, respectively, wherein said first and third switches cooperate with each other to switch both the other electrodes of said second and third variable capacitors between floating and being subjected to said third potential, and said second and fourth switches cooperate with each other to switch both the other electrodes of said second and third variable capacitors between floating and being subjected to said fourth potential.

2. The voltage controlled oscillator according to claim 1, wherein said first variable capacitor is made of a varactor device to which a control voltage is input and which varies in capacitance in accordance with the control voltage.

3. The voltage controlled oscillator according to claim 1, wherein said second and third variable capacitors are made of varactor devices to which a control voltage is input and which vary in capacitance in accordance with the control voltage.

4. The voltage controlled oscillator according to claim 1, wherein said third potential is higher than the fourth potential, said first and third switches are P-channel transistors, and said second and fourth switches are N-channel transistors.

5. The voltage controlled oscillator according to claim 1, wherein said first and third potentials are a power supply potential, and said second and fourth potentials are a ground potential.

6. The voltage controlled oscillator according to claim 1, wherein said inductor is a spiral inductor formed on a substrate.

7. The voltage controlled oscillator according to claim 1, wherein said amplifying unit comprises:

a first P-channel transistor having either one of its source and drain subjected to said first potential, the other connected to said first output terminal, and its gate connected to said second output terminal;

a second P-channel transistor having either one of its source and drain subjected to said first potential, the other connected to said second output terminal, and its gate connected to said first output terminal;

a first N-channel transistor having either one of its source and drain subjected to said second potential, the other connected to said first output terminal, and its gate connected to said second output terminal; and a second N-channel transistor having either one of its source and drain subjected to said second potential, the other connected to said second output terminal, and its gate connected to said first output terminal.

8. The voltage controlled oscillator according to claim 1, wherein a plurality of capacitance switch units each comprising said second and third variable capacitors and said first through fourth switches are provided and connected between said first and second output terminals, in parallel with each other.

9. The voltage controlled oscillator according to claim 1, being used as a local oscillator of a phase-locked loop circuit.

* * * * *